(12) United States Patent
Guan et al.

(10) Patent No.: US 10,873,173 B1
(45) Date of Patent: Dec. 22, 2020

(54) REDUCING BACK REFLECTION IN HYBRID LASERS

(71) Applicant: Elenion Technologies, LLC, New York, NY (US)

(72) Inventors: Hang Guan, New York, NY (US); Yang Liu, Elmhurst, NY (US); Ran Ding, New York, NY (US); Andreas Weirich, Ottawa (CA); Michael J. Hochberg, New York, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/438,572

(22) Filed: Jun. 12, 2019

(51) Int. Cl.
| | | |
|---|---|---|
| *H01S 3/23* | (2006.01) | |
| *G02B 6/14* | (2006.01) | |
| *G02B 6/126* | (2006.01) | |
| *G02B 6/30* | (2006.01) | |
| *H01S 3/063* | (2006.01) | |
| *G02B 6/122* | (2006.01) | |
| *G02B 6/12* | (2006.01) | |

(52) U.S. Cl.
CPC ............ *H01S 3/2375* (2013.01); *G02B 6/126* (2013.01); *G02B 6/1228* (2013.01); *G02B 6/14* (2013.01); *G02B 6/30* (2013.01); *H01S 3/063* (2013.01); *G02B 2006/12152* (2013.01); *G02B 2006/12195* (2013.01)

(58) Field of Classification Search
CPC ......... H01S 3/2375; H01S 3/063; G02B 6/14; G02B 6/126; G02B 6/1228; G02B 6/30; G02B 2006/12195; G02B 2006/12152
See application file for complete search history.

(56) References Cited

U.S. PATENT DOCUMENTS

| | | | |
|---|---|---|---|
| 9,746,609 B2 | 8/2017 | Ma et al. | |
| 9,829,632 B2* | 11/2017 | Ma | G02B 6/1228 |
| 2007/0133990 A1* | 6/2007 | Kim | G02B 6/4204 |
| | | | 398/72 |
| 2010/0215309 A1* | 8/2010 | Shubin | G02F 1/025 |
| | | | 385/3 |
| 2016/0238860 A1* | 8/2016 | Liang | H01S 5/026 |
| 2016/0301191 A1* | 10/2016 | Orcutt | H04B 10/5053 |
| 2018/0261978 A1* | 9/2018 | Kurczveil | H01S 5/3412 |

OTHER PUBLICATIONS

Bo Peng, Jessie Rosenberg, Wesley D. Sacher, Asger S. Jensen, Marwan Khater, William M. J. Green, and Tymon Barwicz, "Distributed backscattering in production O-band Si nanophotonic waveguides," Opt. Express 25, 23477-23485 (2017).
Klaus Petermann. "External optical feedback phenomena in semiconductor lasers." Broadband Networks: Strategies and Technologies. vol. 2450. International Society for Optics and Photonics, 1995.

* cited by examiner

*Primary Examiner* — Xinning(Tom) Niu
(74) *Attorney, Agent, or Firm* — Stratford Managers Corporation

(57) ABSTRACT

In conventional hybrid lasers large back refection may lead to a degradation of relative intensity noise (RIN), linewidth broadening, mode hopping, etc. To solve the aforementioned problem a hybrid laser includes a mode converter for converting a higher-back-reflection mode of the light to a mode providing less back reflection to the gain chip. The mode converter may comprise a polarization rotator, a waveguide converter, or high-order mode converter. A routing waveguide may be provided including a phase shifter, e.g. a doped waveguide, for adjusting a cavity length of the laser cavity.

19 Claims, 10 Drawing Sheets

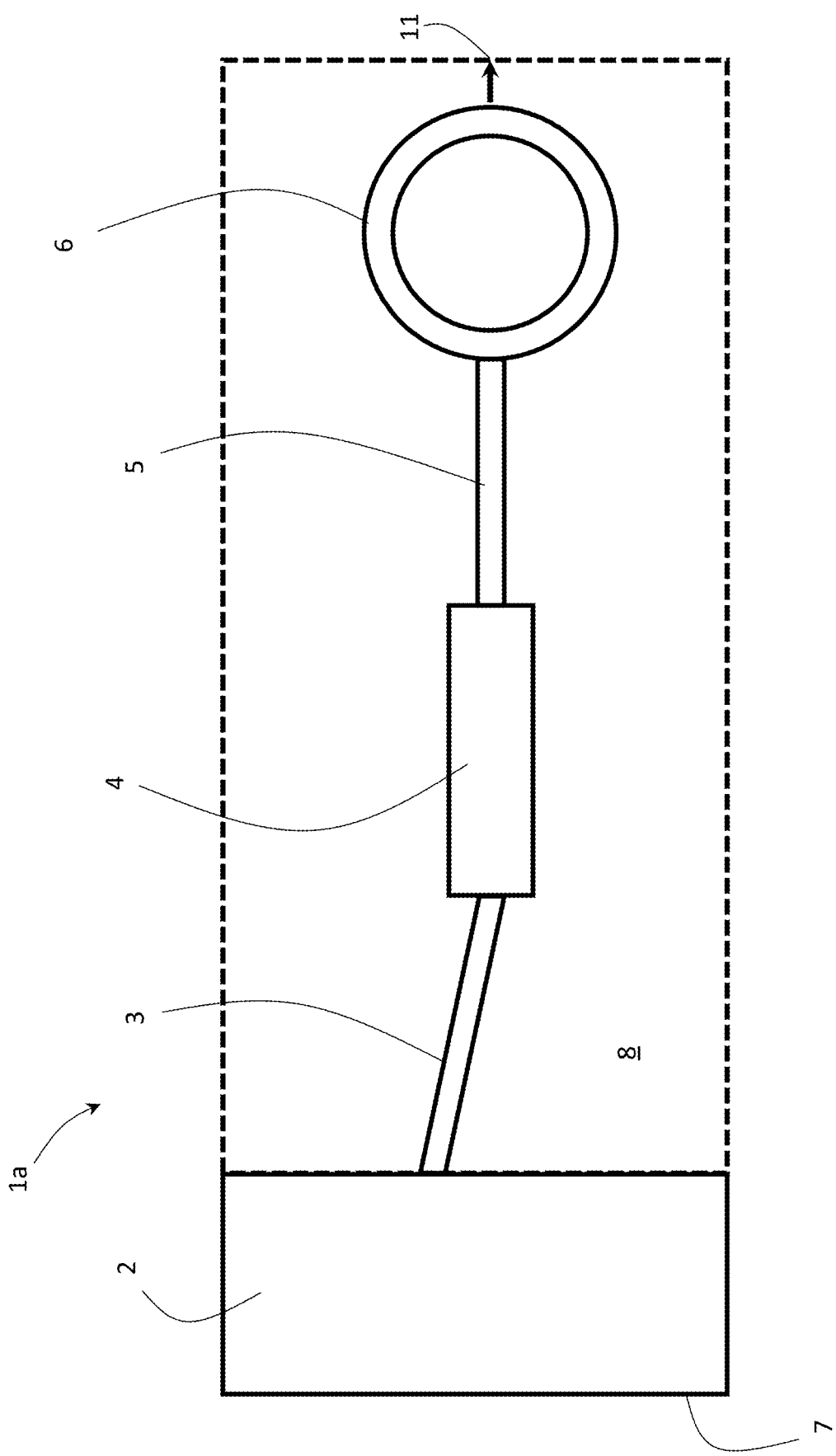

Ridge waveguide, $TE_0$ mode

−21 dB back-reflection for 1 cm waveguide

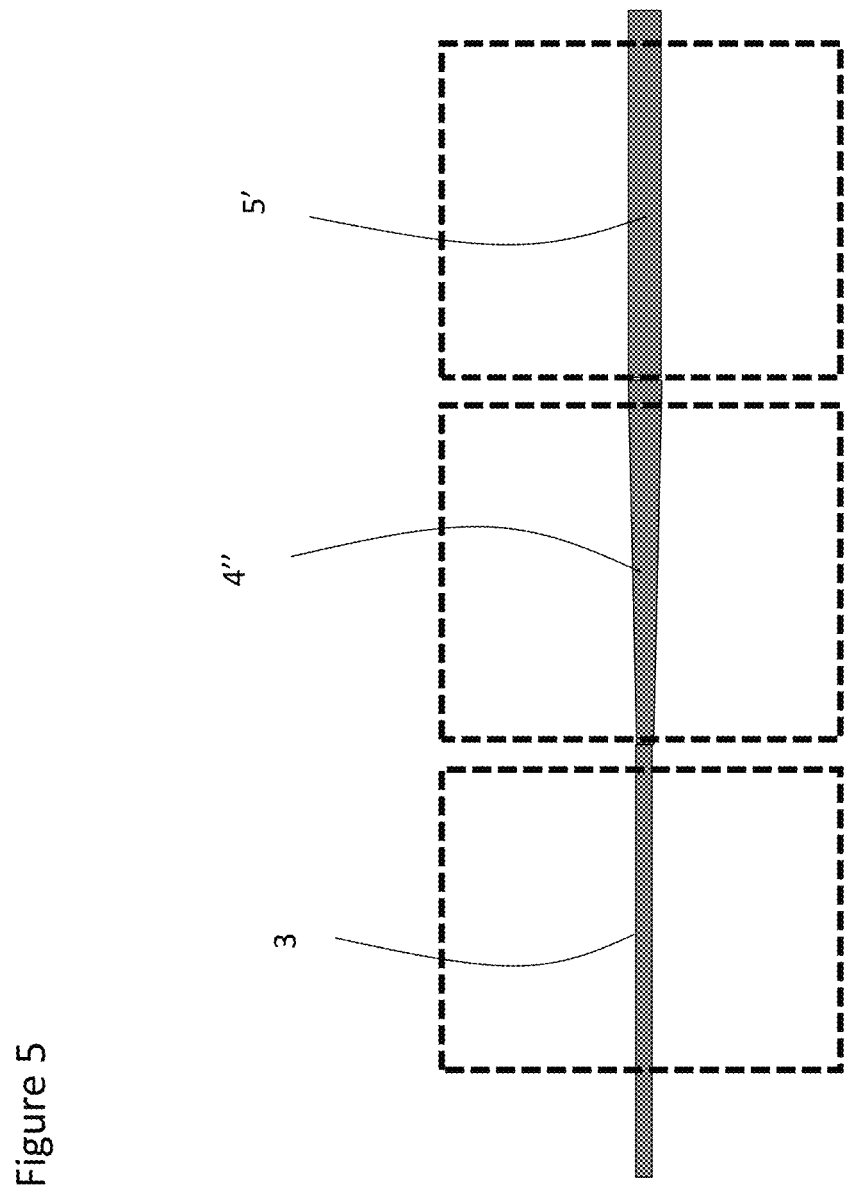

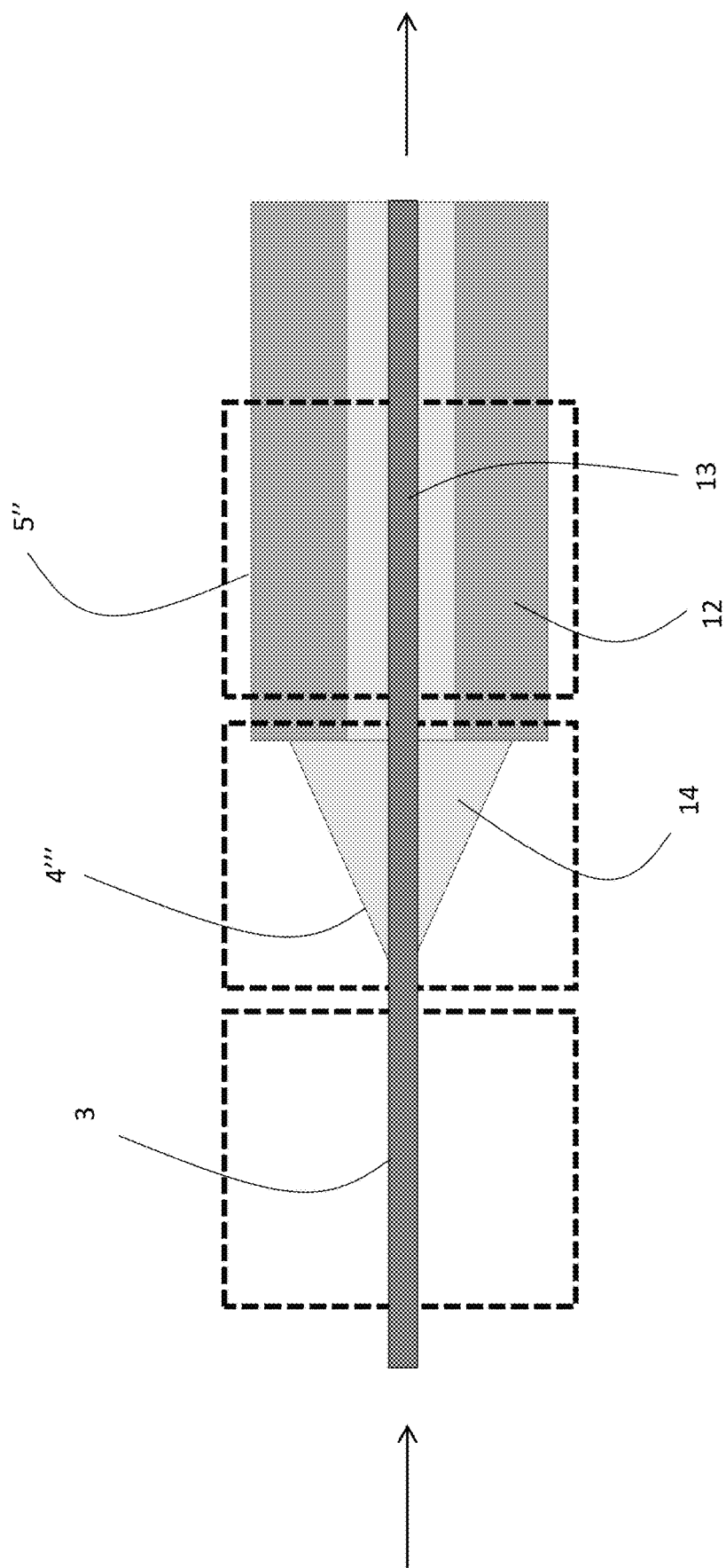

REDUCING BACK REFLECTION IN HYBRID LASERS

TECHNICAL FIELD

The present invention relates to a hybrid laser, and in particular to a hybrid laser with reduced back reflection.

BACKGROUND

Conventional silicon photonics-based hybrid lasers are sensitive to external feedback. Large back refection leads to a degradation of relative intensity noise (RIN), linewidth broadening, mode hopping, etc.

Previous attempts at reducing back reflection include the use of an integrated isolator; however, integrated isolators on a chip are extremely difficult and expensive to implement and have large insertion loss and low isolation. Alternatively, the use of an angled coupling interface between the III-V gain chip and the silicon chip has been tried, but this increases the difficulty in aligning the III-V gain chip and the silicon chip, and the back reflection reduction is limited. Another solution includes the use of index-matching materials between the gain chip and the silicon chip, but the shortcomings include an increase in the packaging complexity and cost.

An object of the present invention is to overcome the shortcomings of the prior art by implementing an on-chip mode converter to reduce the accumulated back reflection as light travels back-and-forth within the PIC chip.

SUMMARY OF THE INVENTION

Accordingly, the present invention relates to a hybrid laser comprising:

a gain chip including a gain medium for generating and amplifying light;

a first reflector optically coupled to the gain medium for reflecting at least a portion of the light back through the gain medium;

a photonic integrated circuit (PIC) chip comprising:

an edge coupler for transmitting the light between the gain chip and a device layer on the PIC chip;

a mode converter for converting a mode of the light to a mode providing less back reflection to the gain chip;

a routing waveguide extending from the mode converter;

a second reflector coupled to the routing waveguide for reflecting at least a portion of the light back to the gain medium forming a laser cavity with the first reflector; and an output port coupled to the first or second reflector for outputting a portion of the light.

BRIEF DESCRIPTION OF THE DRAWINGS

The invention will be described in greater detail with reference to the accompanying drawings which represent preferred embodiments thereof, wherein:

FIG. 1A is a schematic diagram of a hybrid laser in accordance with an embodiment of the present invention;

FIG. 5 is a schematic diagram of a middle section of the hybrid laser of FIG. 1A or 1B according to an embodiment of the present invention; and FIG. 6 is a schematic diagram of a middle section of the hybrid laser of FIG. 1A or 1B according to an embodiment of the present invention.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1B:
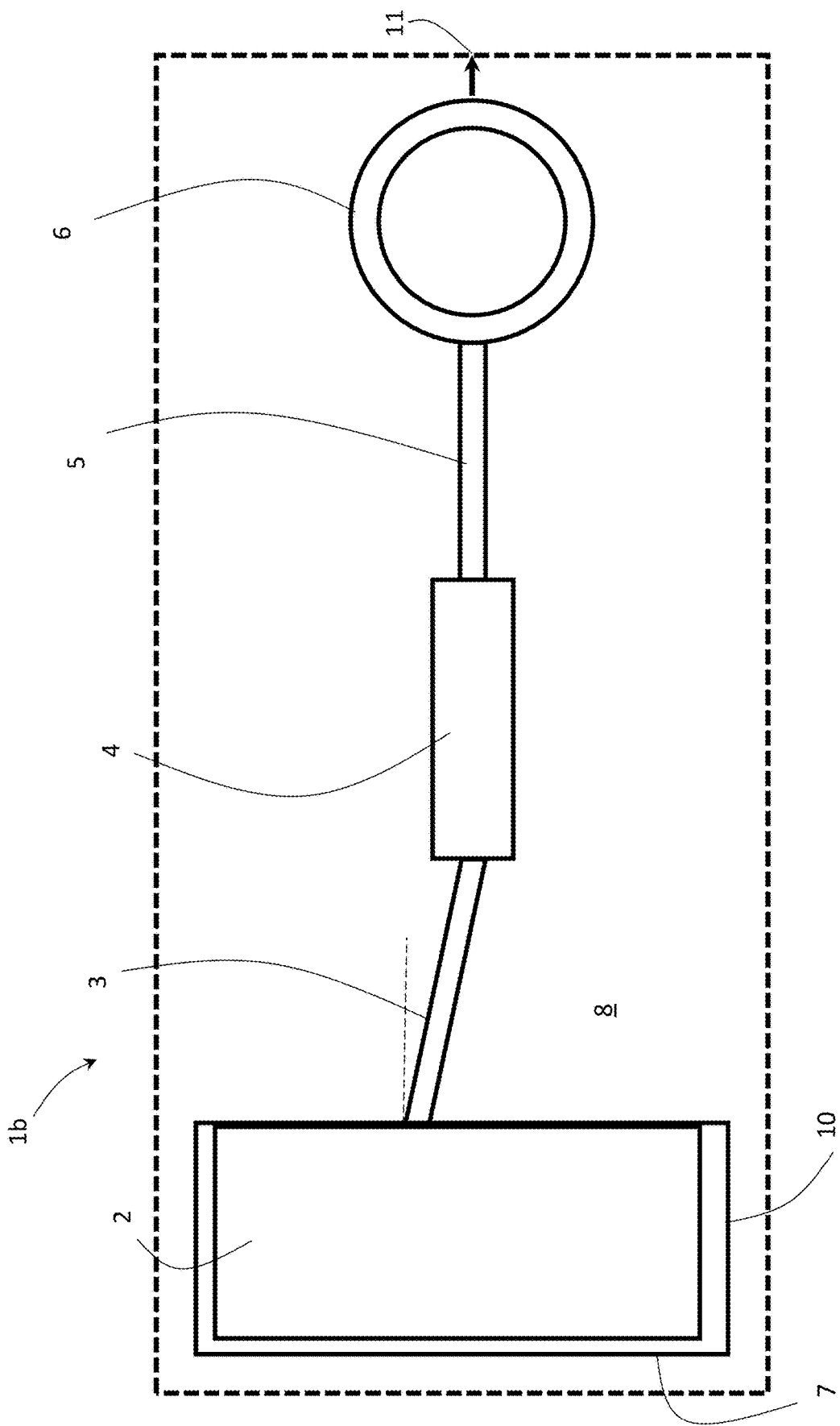
FIG. 1B is a schematic diagram of a hybrid laser in accordance with another embodiment of the present invention.

FIGS. 1A and 1B illustrate schematic views of hybrid lasers 1a and 1b, respectively, in accordance with embodiments of the present invention. Each of the hybrid lasers 1a and 1b is comprised of: a gain chip 2, an edge coupler 3, a mode converter 4, a routing waveguide 5 with or without a phase shifter, a first reflector 6, and a second reflector 7.

The gain chip 2 includes a gain medium, which may comprise any suitable amplification material, e.g. a suitable group III-V gain material, such as InP, GaAs and GaN based materials, in particular a reflective semiconductor optical amplifier (RSOA), which may be based on bulk, quantum well or quantum dot material. The gain chip 2 may be provided on a photonic integrated circuit (PIC) chip 8 with the other elements of the hybrid laser 1b (FIG. 1B) or the gain chip 2 may be provided on a separate gain chip fixed to the side of the PIC chip 8 with the remaining elements of the hybrid laser 1a provided thereon (FIG. 1A). The gain chip 2 may be a reflective semiconductor optical amplifier (RSOA), which may be placed, e.g. flip-chip bonded, into a trench 10 on the PIC chip 8 (FIG. 1B). The gain chip 2 may include a highly reflective, e.g. <95% of light in a desired wavelength range, surface on an outer facet thereof forming the second reflector 7 (FIG. 1A). Alternatively, an independent reflector, e.g. on a facet of the PIC chip 8 (FIG. 1B) or on a separate chip (not shown), may be provided to form the second reflector 7.

The first reflector 6 may comprise, but not limited to the following variations: a) single ring reflector, (b) a Sagnac loop mirror, (c) a Vernier ring reflector, (d) a distributed Bragg reflector, and (e) a distributed feedback reflector. The first reflector 6 may be a partial reflector with a reflectance of between 30% and 90% of the light in the desired wavelength range forming an output port 11 for amplified light at the desired wavelength. The reflectance of the first and second reflectors 6 and 7 may be reversed providing the output port 11 at the second reflector 7, i.e. proximate the gain chip 2.

The edge coupler 3 may include an angled mode converter, which may include be angled at a small acute angle to a normal from the output facet of the gain medium 2, e.g. by 5° to 15°, and may include an anti-reflection coating to reduce the back reflection at the output facet. The edge coupler 3 may also include an mode spot-size converter, which may include a tapering width and or height for expanding the mode reentering the gain chip 2 and for contracting the mode leaving the gain chip 2.

The routing waveguide 5 may comprise a wide ridge waveguide, a strip-loaded waveguide, or other low back-scattering waveguide, and may be comprised of any suitable material, for example semiconductor waveguides, such as silicon and silicon nitride, etc.

Light generated or amplified in the gain chip 2 is coupled through the edge coupler 3 onto a device layer on the PIC chip 8. The mode converter 4 formed in the device layer transforms the shape of the mode of the light to a mode shape providing less back reflection to the gain medium. For example, the mode converter 4 may comprise a polarization rotator, which rotates the TE0 mode leaving the gain chip 2 into the TM0 mode, or the mode converter 4 may comprise a waveguide converter, which converts the shape of the edge coupler 3, e.g. a ridge waveguide, into a less back-reflective form of waveguide, e.g. a bus waveguide or a rib waveguide. The adjusted mode travels through the routing waveguide 5, which may comprise a structure corresponding to the selected mode converter 4, e.g. ridge for polarization rotator, bus for ridge-to-bus waveguide converter, and rib for ridge-to-rib waveguide converter. Then at least a portion of the adjusted mode gets reflected by the first reflector 6 back through the routing waveguide 5 to the mode converter 4, which converts the mode shape back to the original mode shape, e.g. TE0 in a ridge waveguide, for reentry into the gain medium of the gain chip 2, via the edge coupler 3. Light bounces back and forth between the second reflector 7 and the first reflector 6, and becomes the wanted laser output at an output port 11 provided at the first or second reflector 6 or 7. To ensure only selective wavelength gets amplified in the gain medium a highly reflective reflector 6 or 7 may include a wavelength selective filter coating for passing unwanted wavelengths out of the laser cavity. Alternatively or in addition, an optical filter may be provided within the laser 1A or 1B to pass the desired wavelengths and filter out unwanted wavelengths.

The routing waveguide 5 may also include a phase shifter for adjusting and/or selecting the optical distance between the first and second reflectors 6 and 7, i.e. the laser cavity length, and therefore the wavelength of the output light. The phase shifter may comprise a special type of routing waveguide 5, because the phase shifter may be comprised of a doped waveguide, as opposed to the normal routing waveguide 5, which is not necessarily doped. Since the phase shifter is doped, the phase may be controlled by adding different biasing voltages via a control system to automatically maintain the same wavelength over time or to adjust to a different wavelength. A light detector, e.g. a <5% tap and a photodetector, positioned prior to the output port 11 may be used to provide information about wavelength and power of the output light to the control system. The phase shifter, or doped waveguide, may be important to the hybrid laser 1a or 1b, for wavelength selection and to avoid mode-hopping during the operation of laser.

Figure 2A:
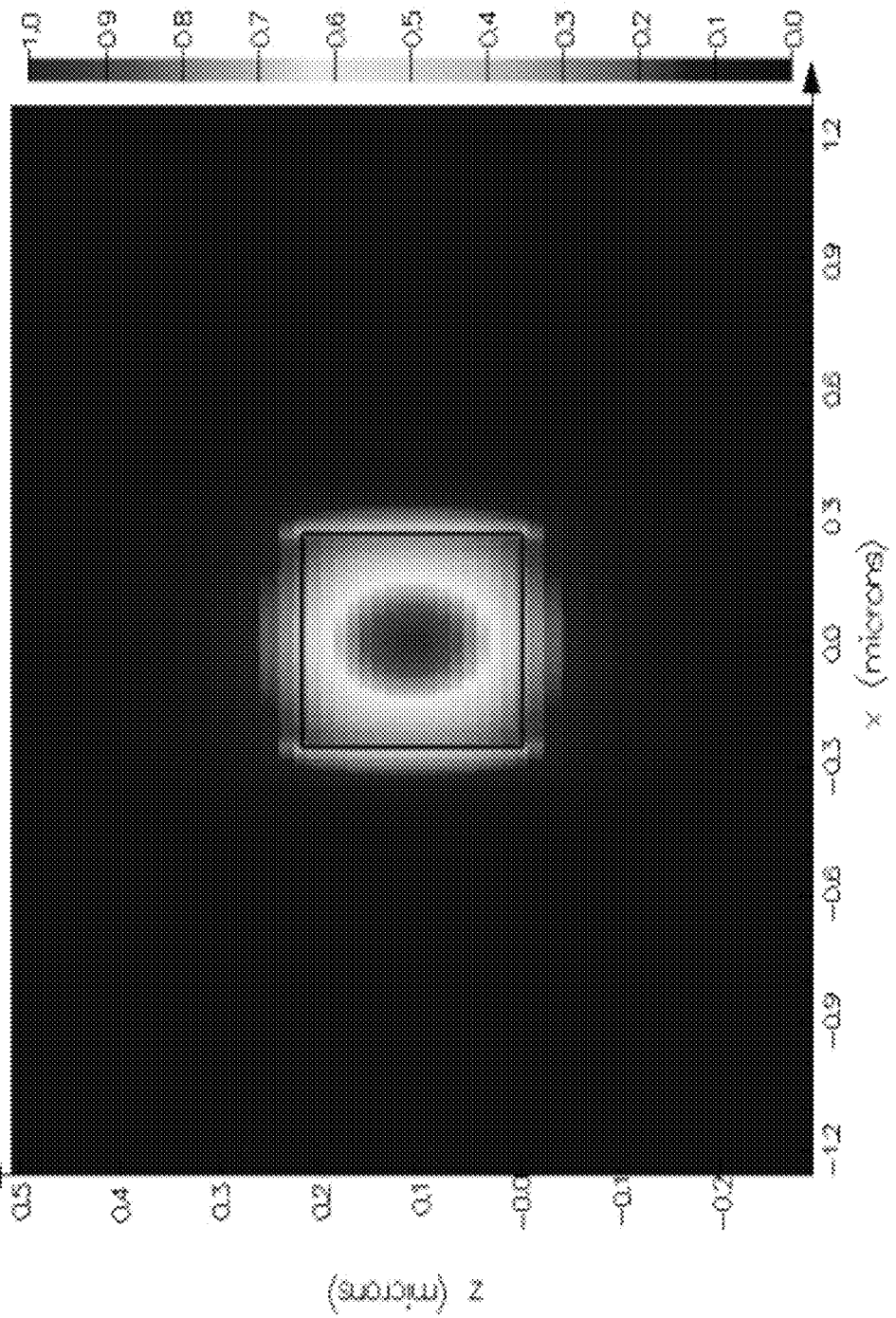
FIGS. 2A and 2B are mode profiles for ridge waveguides for different polarizations.
Figure 2B:
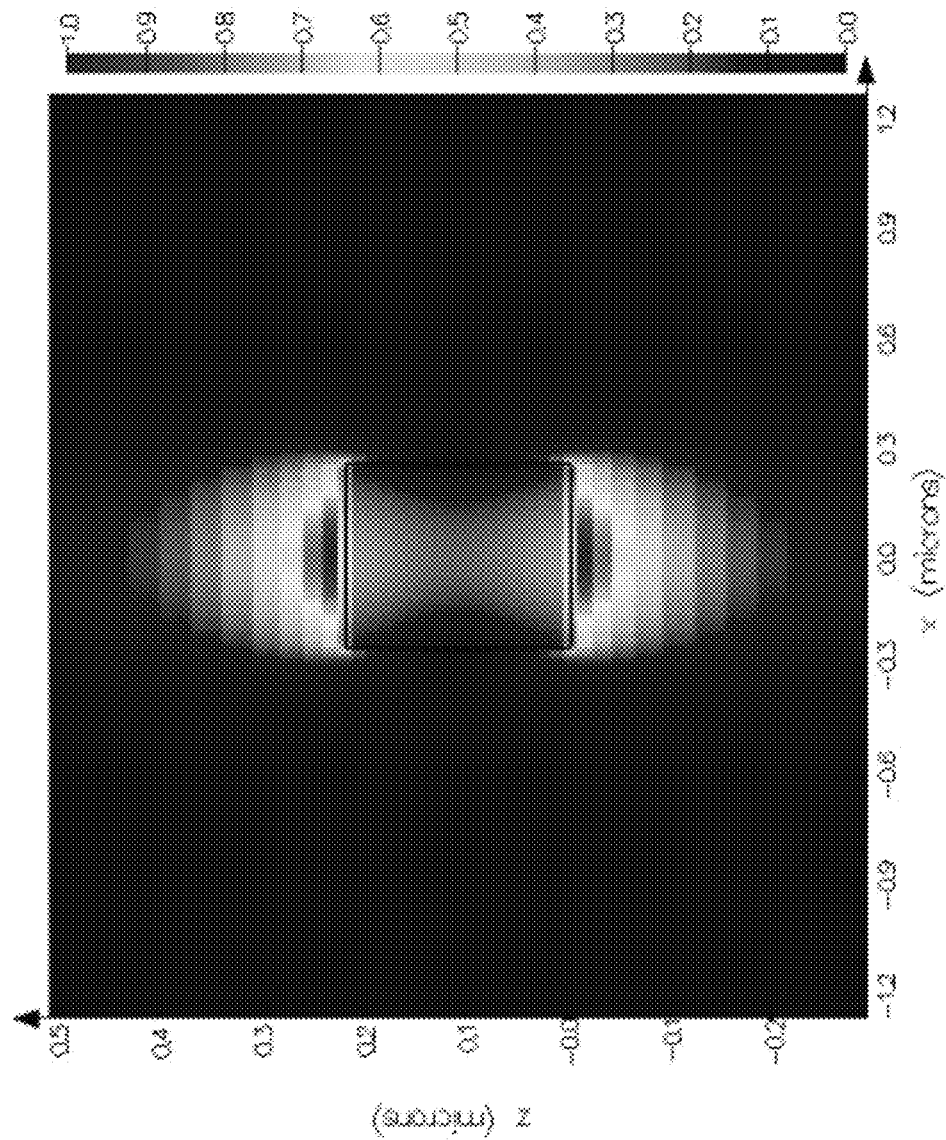

FIGS. 2(A) and 2(B) illustrate the geometric dimensions, mode profiles, and measured back-reflection of silicon photonic ridge waveguides. With reference to FIG. 2A, a ridge waveguide with a TE0 mode has the largest back-reflection, i.e. −21 dB for 1 cm long waveguide. Accordingly, when a ridge waveguide with a TE0 mode combination is used as the routing waveguide 5 and mode, a tremendous amount of reflected power is introduced into the gain chip 2, which degrades the performance of the laser 1a or 1b. To solve this problem, the mode converter 4 is provided between the edge coupler 3 and the routing waveguide 5. Accordingly, if a ridge waveguide and TM0 mode is used for the routing waveguide 5 in the PIC chip 8, the back-reflection caused by the routing waveguide 5 may be reduced by −19 dB (from −21 dB/cm to −40 dB/cm), which will significantly reduce the back-reflection into the gain chip 2, and thus improve the laser performance.

Figure 3A:
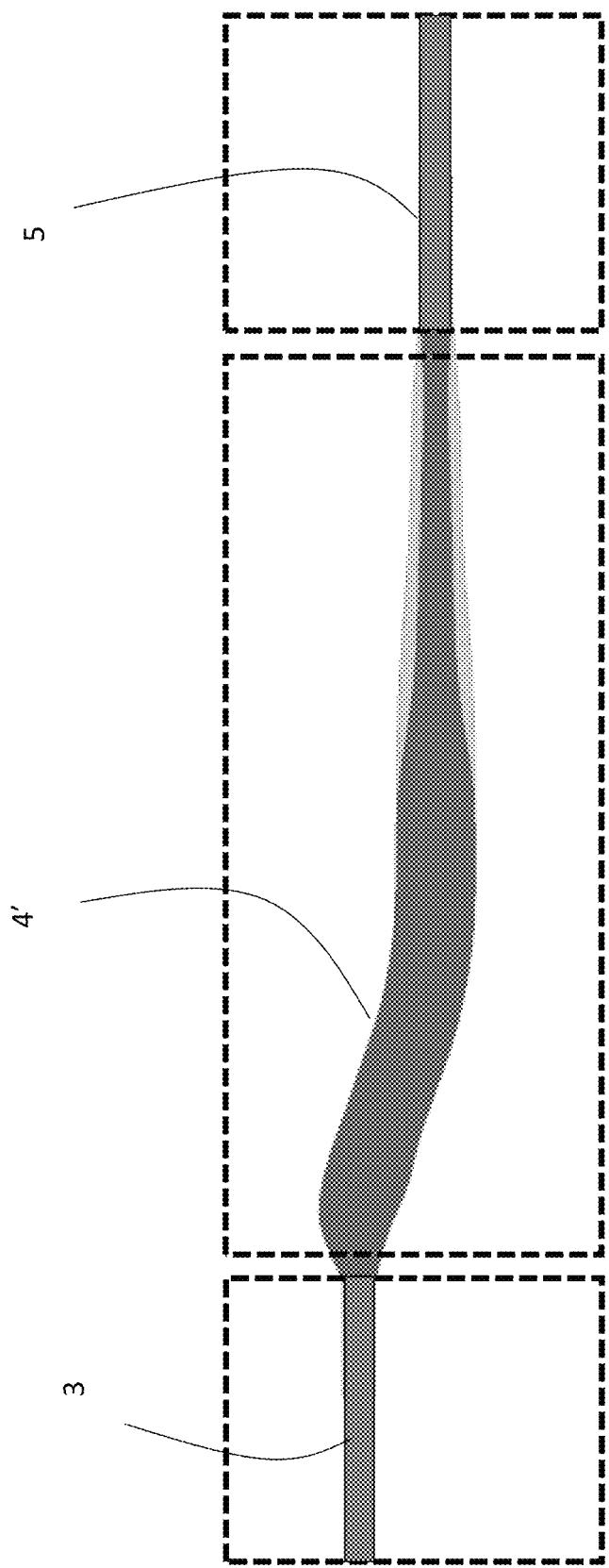
FIG. 3A is a schematic diagram of a middle section of the hybrid laser of FIG. 1A or 1B according to an embodiment of the present invention.

According to an exemplary embodiment, illustrated in FIG. 3, the middle section of the hybrid laser 1a or 1b may include the edge coupler 3, which may include a ridge waveguide for receiving a TE0 mode from the laser chip 2. The mode converter 4', e.g. polarization rotator, may comprise a bent and tapered optical waveguide polarization rotator, such as one disclosed in U.S. Pat. No. 9,829,632 issued Nov. 28, 2017 in name of Ma et al, which is incorporated herein by reference, for rotating the polarization of the light from the TE0 mode to the TM0 mode, and then from the TM0 mode back to the TE0 mode upon return from the first reflector 6. The routing waveguide 5 may also be comprised of a ridge waveguide.

Figure 3B:
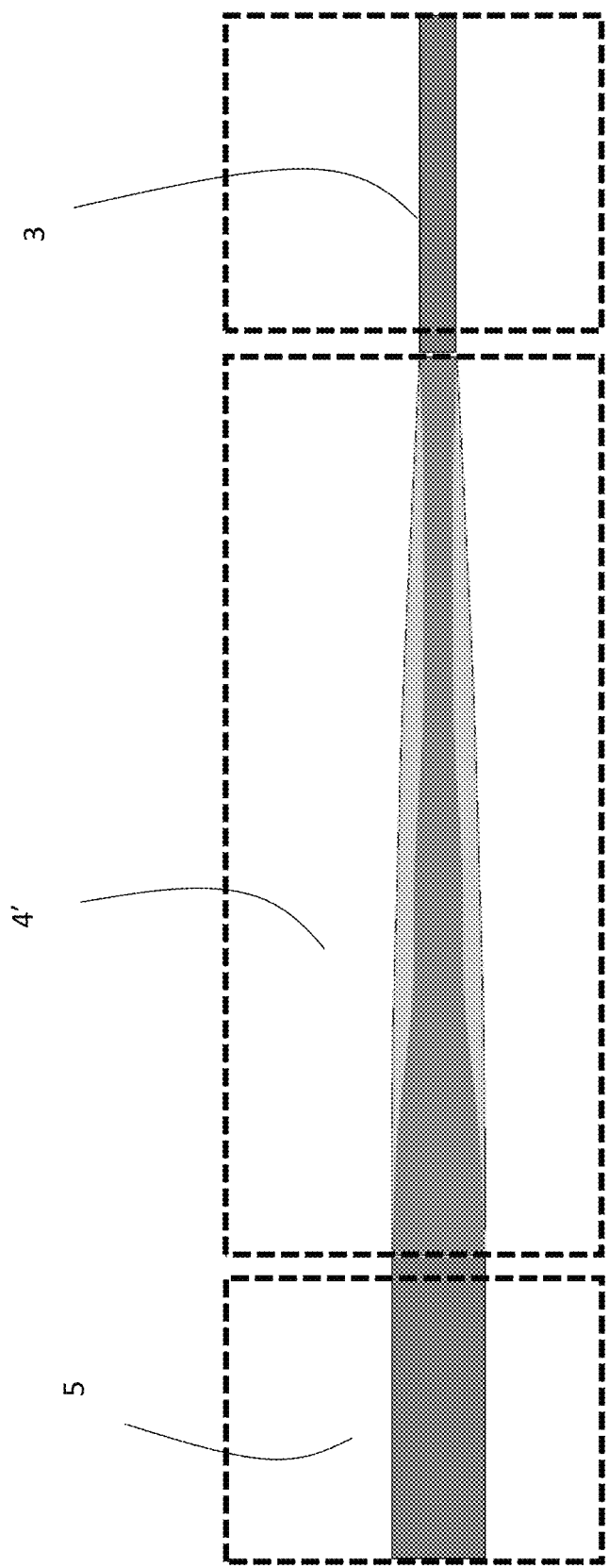
FIG. 3B is a schematic diagram of a middle section of the hybrid laser of FIG. 1A or 1B according to an embodiment of the present invention.

With reference to FIG. 3B, the mode converter 4' may also comprise a higher-order mode converter, e.g. a TM0-to-TE1 mode converter, and a TE0-to-TE1 mode converter, such as disclosed in U.S. Pat. No. 9,746,609 issued Aug. 29, 2017 to Ma et al, and U.S. Pat. No. 9,829,632 issued Nov. 28, 2017 in name of Ma et al, which are incorporated herein by reference. Any other suitable polarization rotator is also within the scope of the invention. As illustrated in FIG. 3B, to reduce the back-reflection to the gain chip 2, the mode converter 4', e.g. a TM0-to-TE1 mode converter, expands the ridge waveguide forming the edge coupler 3 into a wide bus routing waveguide 5, changing the TM0 mode into a high-order TE1 mode. The mode converter 4' may comprises a bi-layer taper having an input porta at the output of the edge coupler 3 and an output port at the input of the routing waveguide. The bi-layer taper includes a first lower slab layer with a width that continuously expands from the input port to the output port; and a second upper ridge layer with a width that initially tapers and then widens from the input port to the output port.

Figure 4A:
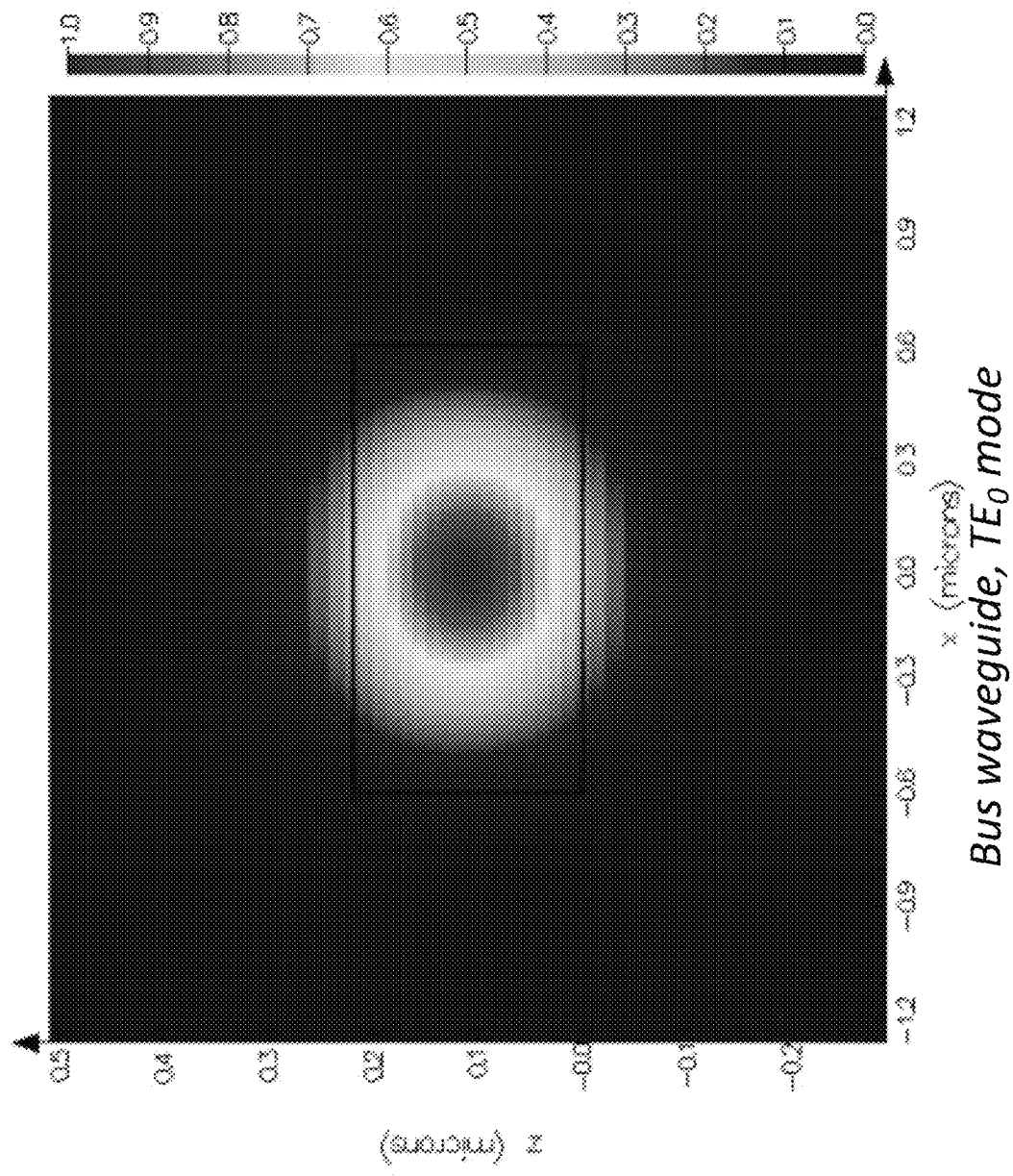
FIGS. 4A and 4B are mode profiles for bus and rib waveguides, respectively.
Figure 4B:
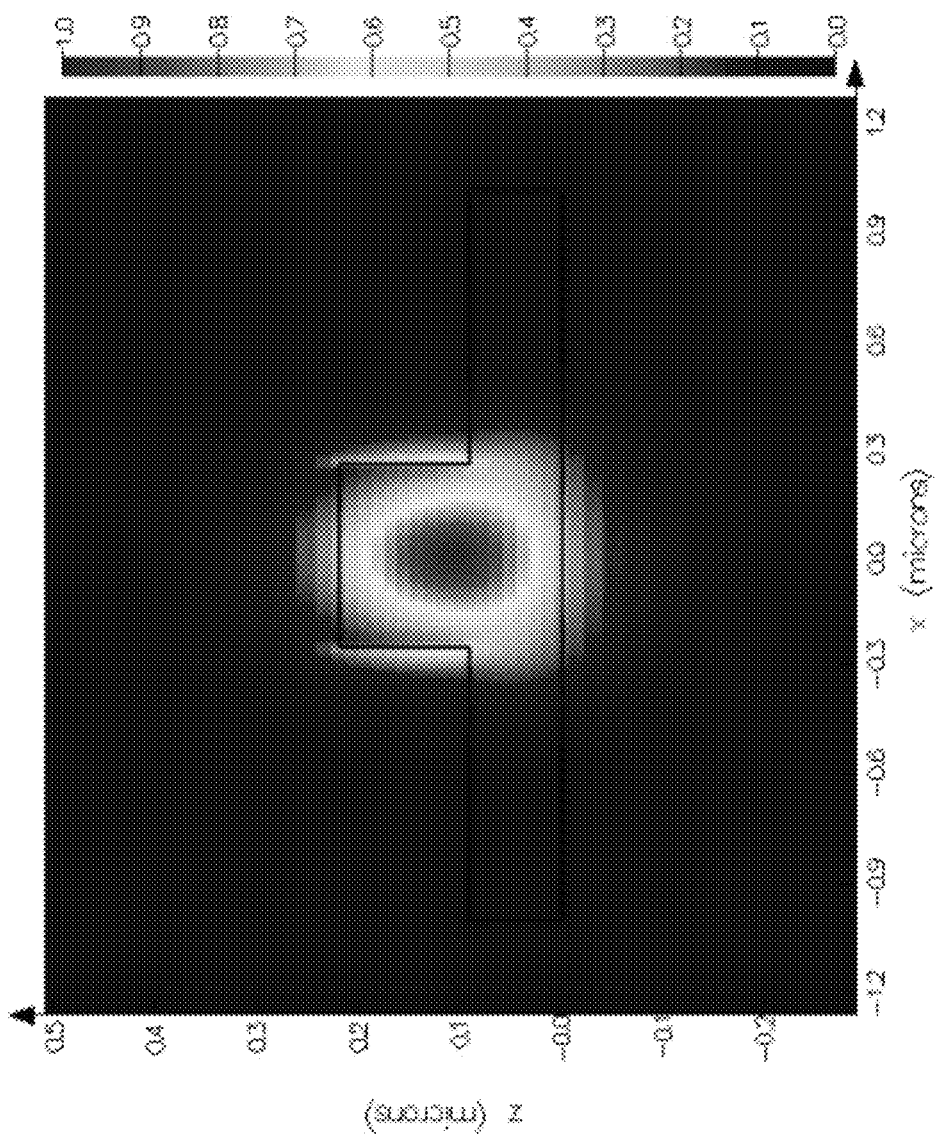

FIGS. 4(A) and 4(B) illustrate the geometric dimensions, mode profiles, and measured back-reflection of silicon photonic bus and rib waveguides, respectively.

Accordingly, in an alternative exemplary embodiment illustrated in FIG. 5, to reduce the back-reflection to the gain chip 2, the mode converter 4", e.g. a tapering ridge-to-bus waveguide converter, expands the ridge waveguide forming the edge coupler 3 into a bus waveguide, while maintaining the TE0 mode. The edge coupler 3 may be comprised of a ridge waveguide, e.g. with a width of 400 nm to 600 nm, and a height of about 150 nm to 300 nm, and the routing waveguide 5' may be comprised of a bus waveguide, e.g. with a width of 800 nm to 1200 nm and a height of about 150 nm to 300 nm. Accordingly, the waveguide converter 4" comprises a gradually, e.g. adiabatically, expanding waveguide with a width (and/or height) that expands by at least twice the original width, e.g. from the width (and/or height) of the ridge waveguide 3 to the width (and/or height) of the bus waveguide 5'. As a result, the back reflection of the routing waveguide 5 is reduced by 16 dB/cm (from −21 dB/cm to −37 dB/cm) as in FIGS. 4(A) and 4(B).

According to another alternative exemplary embodiment illustrated in FIG. 6, to reduce the back-reflection to the gain chip 2, the mode converter 4''', e.g. a tapering ridge-to-rib waveguide converter, expands the ridge waveguide forming the edge coupler 3 into a rib waveguide, while maintaining the TE0 mode. The edge coupler 3 may be comprised of a ridge waveguide, e.g. with a width of 400 nm to 600 nm, and a height of about 150 nm to 300 nm, and the routing waveguide 5" may be comprised of a rib waveguide, e.g.

with a lower slab region 12 with a width of 1200 nm to 1800 nm and a height of 50 nm to 150 nm, and an upper ridge region 13 with a width of 400 nm to 600 nm and a height of 50 nm to 150 nm. Accordingly, the waveguide converter 4''' comprises a gradually, e.g. adiabatically, expanding, e.g. linearly or exponentially, lower slab waveguide region 14 with a width that expands by at least twice the original width, e.g. from the width of the ridge waveguide 3 to about the width of the slab region 12 of the rib waveguide 5. As a result, the back reflection of the routing (rib) waveguide 5 is reduced by 13 dB/cm (from −21 dB/cm to −34 dB/cm).

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hybrid laser comprising:
a gain chip including a gain medium for generating and amplifying light;
a first reflector optically coupled to the gain medium for reflecting at least a first portion of the light back through the gain medium;
a photonic integrated circuit (PIC) chip comprising:
an edge coupler for transmitting the light between the gain chip and a device layer on the PIC chip;
a mode converter for converting a mode of the light to a mode providing less back reflection for light traveling back and forth within the PIC chip;
a routing waveguide extending from the mode converter; and
a second reflector coupled to the routing waveguide for reflecting at least a second portion of the light back to the gain medium forming a laser cavity with the first reflector; and
an output port coupled to the first or second reflector for outputting laser light;
wherein the mode converter comprises a waveguide converter for converting a ridge waveguide to a rib waveguide; and
wherein the routing waveguide comprises the rib waveguide, comprising a wider lower slab region and a narrower upper ridge region.

2. The hybrid laser according to claim 1, wherein the routing waveguide includes a phase shifter for adjusting a laser cavity length of the laser cavity.

3. The hybrid laser according to claim 2, wherein the phase shifter comprises a doped waveguide; and
further comprising a controller capable of applying a bias voltage to the doped waveguide.

4. The hybrid laser according to claim 1, wherein the edge coupler comprises a spot-size converter extending from the gain medium for reducing a mode size of the light exiting the gain medium.

5. The hybrid laser according to claim 4, wherein the edge coupler extends at an acute angled from a normal from the gain chip to reduce back reflection into the gain medium.

6. A hybrid laser comprising:
a gain chip including a gain medium for generating and amplifying light;
a first reflector optically coupled to the gain medium for reflecting at least a first portion of the light back through the gain medium;
a photonic integrated circuit (PIC) chip comprising:
an edge coupler for transmitting the light between the gain chip and a device layer on the PIC chip;
a mode converter for converting a mode of the light to a mode providing less back reflection for light traveling back and forth within the PIC chip;
a routing waveguide extending from the mode converter;
a second reflector coupled to the routing waveguide for reflecting at least a second portion of the light back to the gain medium forming a laser cavity with the first reflector; and
an output port coupled to the first or second reflector for outputting laser light;
wherein the mode converter comprises a polarization rotator comprising a bent and tapered optical waveguide polarization rotator.

7. The hybrid laser according to claim 6, wherein the polarization rotator is for converting between a TE0 mode and a TM0 mode.

8. The hybrid laser according to claim 6, wherein the polarization rotator comprises a high-order mode converter selected from the group consisting of a TM0-to-TE1 mode converter, and a TE0-to-TE1 mode converter.

9. A hybrid laser comprising:
a gain chip including a gain medium for generating and amplifying light;
a first reflector optically coupled to the gain medium for reflecting at least a first portion of the light back through the gain medium;
a photonic integrated circuit (PIC) chip comprising:
an edge coupler for transmitting the light between the gain chip and a device layer on the PIC chip;
a mode converter for converting a mode of the light to a mode providing less back reflection for light traveling back and forth within the PIC chip;
a routing waveguide extending from the mode converter;
a second reflector coupled to the routing waveguide for reflecting at least a second portion of the light back to the gain medium forming a laser cavity with the first reflector; and
an output port coupled to the first or second reflector for outputting laser light;
wherein the mode converter comprises a waveguide converter for converting a ridge waveguide to a bus waveguide; and
wherein the routing waveguide comprises the a bus waveguide.

10. The hybrid laser according to claim 9, wherein the waveguide converter expands in width from a first end having a first width a same as the ridge waveguide to a second end having a second width a same as the bus waveguide, which is at least twice the first width of the first end.

11. The hybrid laser according to claim 9, wherein the waveguide converter comprises a gradually tapering waveguide which expands from 400 µm to 500 µm wide to between 800 µm to 1200 µm wide.

12. The hybrid laser according to claim 1, wherein the waveguide converter includes a slab region expanding in width from a first end having a first width a same as the ridge waveguide to a second end having a second width a same as the slab region of the routing waveguide, which is at least twice the first width of the first end.

13. The hybrid laser according to claim 1, wherein the waveguide converter comprises a tapering slab region, which gradually expands from 400 μm to 500 μm wide to between 800 μm to 1200 μm wide.

14. The hybrid laser according to claim 1, wherein the PIC chip includes a trench for receiving the gain chip.

15. The hybrid laser according to claim 1, wherein the first reflector comprises a reflective facet of the gain chip.

16. The hybrid laser according to claim 1, wherein the first reflector is <95% reflective to selected wavelengths in the light.

17. The hybrid laser according to claim 1, wherein the second reflector is between 30% and 90% reflective to selected wavelengths in the light.

18. The hybrid laser according to claim 17, wherein the second reflector comprises a reflector selected from the group consisting of a single ring reflector, a Sagnac loop mirror, a Vernier ring reflector, a distributed Bragg reflector, and a distributed feedback reflector.

19. The hybrid laser according to claim 17, wherein the output port is coupled to the second reflector.

* * * * *